United States Patent
Tang et al.

(10) Patent No.: US 10,999,549 B2
(45) Date of Patent: May 4, 2021

(54) IMAGE SENSOR, COLUMN PARALLEL ADC CIRCUIT AND A/D CONVERSION METHOD THEREOF

(71) Applicant: PixArt Imaging Incorporation, HsinChu (TW)

(72) Inventors: Kuan Tang, HsinChu (TW); Yi-Cheng Chiu, HsinChu (TW); Chia-Chi Kuo, HsinChu (TW); Jui-Te Chiu, HsinChu (TW)

(73) Assignee: PIXART IMAGING INCORPORATION, Hsinchu (TW)

( * ) Notice: Subject to any disclaimer, the term of this patent is extended or adjusted under 35 U.S.C. 154(b) by 77 days.

(21) Appl. No.: 16/447,072

(22) Filed: Jun. 20, 2019

(65) Prior Publication Data

US 2020/0404205 A1    Dec. 24, 2020

(51) Int. Cl.
| | |
|---|---|
| *H04N 5/378* | (2011.01) |
| *H04N 5/353* | (2011.01) |
| *H04N 5/357* | (2011.01) |
| *H03M 1/36* | (2006.01) |
| *H03M 1/56* | (2006.01) |

(52) U.S. Cl.
CPC .............. *H04N 5/378* (2013.01); *H03M 1/36* (2013.01); *H03M 1/56* (2013.01); *H04N 5/357* (2013.01); *H04N 5/3535* (2013.01)

(58) Field of Classification Search
CPC ...... H04N 5/378; H04N 5/3535; H04N 5/357; H03M 1/56; H03M 1/36
See application file for complete search history.

(56) References Cited

U.S. PATENT DOCUMENTS

| | | | | |
|---|---|---|---|---|
| 2002/0134918 A1* | 9/2002 | Miida | .................. | H03G 3/3084 250/214.1 |
| 2012/0033097 A1* | 2/2012 | Lim | ...................... | H03K 21/023 348/222.1 |
| 2012/0312963 A1* | 12/2012 | Storm | .................... | H04N 5/378 250/208.1 |
| 2013/0321683 A1* | 12/2013 | Sonoda | .................. | H04N 5/378 348/302 |
| 2015/0009386 A1* | 1/2015 | Komaba | ............... | H03M 1/123 348/308 |
| 2015/0028190 A1* | 1/2015 | Shin | ........................ | H03M 1/14 250/208.1 |
| 2015/0171871 A1* | 6/2015 | Shin | ....................... | H04N 5/378 341/164 |

(Continued)

*Primary Examiner* — Lin Ye
*Assistant Examiner* — John H Morehead, III
(74) *Attorney, Agent, or Firm* — Tung & Associates

(57) ABSTRACT

A column parallel ADC circuit includes: plural column ADCs and a digital processing circuit. The plural column ADCs generate respective plural digital counts. The plural column ADCs include a first column ADC and a second column ADC. The first column ADC generates a first digital count according to a first analog signal, and the second column ADC generates a second digital count according to a second analog signal. The first digital count is a difference between a first digital signal and a second digital signal. The first and the second digital signals correspond to the first and the second analog signals respectively. The digital processing circuit generates the plural digital signals, wherein the digital processing circuit generates the first digital signal according to the first digital count and the second digital signal.

21 Claims, 15 Drawing Sheets

(56) References Cited

U.S. PATENT DOCUMENTS

| | | | |
|---|---|---|---|
| 2016/0028981 A1* | 1/2016 | Lee | H04N 5/378 |
| | | | 348/241 |
| 2017/0302869 A1* | 10/2017 | Ikuma | H04N 5/365 |
| 2018/0351570 A1* | 12/2018 | Xhakoni | H04N 5/3575 |
| 2019/0104275 A1* | 4/2019 | Hatano | G05D 1/0231 |
| 2019/0289238 A1* | 9/2019 | Ikuma | H04N 5/353 |
| 2019/0313042 A1* | 10/2019 | Janbu | H04N 5/374 |
| 2019/0327440 A1* | 10/2019 | Hoshino | H04N 5/343 |

* cited by examiner

IMAGE SENSOR, COLUMN PARALLEL ADC CIRCUIT AND A/D CONVERSION METHOD THEREOF

BACKGROUND OF THE INVENTION

Field of Invention

The present invention relates to an image sensor. Particularly it relates to a low power image sensor. The present invention also relates to a column parallel ADC circuit and an A/D conversion method for use in the image sensor.

Description of Related Art

FIG. 1A shows a prior art image sensor (image sensor 1) which includes an array of pixel sensing circuits 500, a column parallel analog-to-digital converter (ADC) circuit (column parallel ADC circuit 600). In each of the column ADC (e.g. column ADC 610[1]), the comparator (e.g. 611[1]) compares the corresponding analog signal (e.g. SA[1]) and the ramp signal RMP to generate a corresponding comparison result signal (e.g. CPO[1]). The counter (e.g. 612[1]) is coupled to the comparator 611[1] and is configured to operably count to generate the corresponding digital count (e.g CNT[1]) according to the corresponding comparison result signal CPO[1]. The digital counts (CNT[1] ~CNT[2]) correspond to the analog signals (SA[1]~SA[N]) respectively. For example, referring to FIG. 1B, the digital count CNT[1] is 150 and the digital count CNT[2] is 100, which respectively correspond to the analog signals SA[1] and SA[2]. Note that only the least significant bit of each counter is shown in the figure for illustration.

The prior art circuits in FIG. 1A has a drawback that the counter of each column ADC has to count the complete count, counting from when the ramp signal RMP starts to ramp till when the ramp signal RMP intersects the corresponding analog signal. All the counters count independently as shown in FIG. 1B, which causes significant power consumption; this is even worse as the image resolution is getting higher.

Compared to the prior art in FIG. 1A, the present invention is advantageous in that a portion of the counters in the column parallel ADC circuit do not have to count the complete count as the prior art in FIG. 1A, which can effectively reduce the power consumption.

SUMMARY OF THE INVENTION

From one perspective, the present invention provides a column parallel analog-to-digital converter (ADC) circuit, configured to operably convert plural analog signals to respective plural digital signals, the column parallel ADC circuit comprising: plural column ADCs, configured to operably generate respective plural digital counts, wherein the plural column ADCs include a first column ADC and a second column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and a digital processing circuit, configured to operably generate the plural digital signals, wherein the digital processing circuit generates the first digital signal according to the first digital count and the second digital signal.

In one embodiment, the second digital signal corresponds to the second digital count.

In one embodiment, the plural column ADCs include a third column ADC, wherein the third column ADC is configured to operably generate a third digital count according to a third analog signal, wherein the second digital count is a difference between the second digital signal and a third digital signal, wherein the third digital signal corresponds to the third analog signals; and the digital processing circuit generates the second digital signal according to the second digital count and the third digital signal.

In one embodiment, the column parallel ADC circuit receives a ramp signal, wherein each of the plural column ADCs includes: a comparator, configured to operably compare the corresponding analog signal and the ramp signal to generate a corresponding comparison result signal; and a counter, coupled to the comparator and configured to operably count to generate the corresponding digital count according to the corresponding comparison result signal; wherein the counter of the first column ADC starts to count to generate the first digital count when the comparison result signals of the first column ADC and the second column ADC show that the first analog signal and the second analog signal are at different sides compared to the ramp signal.

In one embodiment, during a conversion period, when the counter of the first column ADC starts to count before the level of the comparison result signal of the second column ADC transits, the counter of the first column ADC counts reversely.

In one embodiment, the first digital signal is generated by summing the first digital count and the second digital signal.

In one embodiment, the plural column ADCs are coupled to an array of pixel sensing circuits which are configured to operably sense a subject signal, and the array of the pixel sensing circuits are formed in at least one row and plural columns corresponding to the plural column ADCs, wherein each column of the pixel sensing circuits is configured to operably generate one corresponding analog signal which is coupled to one corresponding column ADC.

In one embodiment, a first column of the array of the pixel sensing circuits corresponding to the first column ADC is arranged geometrically neighboring to a second column of the array of the pixel sensing circuits corresponding to the second column ADC.

In one embodiment, the plural column ADCs further includes a fourth column ADC, wherein a fourth column of the array of the pixel sensing circuits corresponding to the fourth column ADC is arranged geometrically in between a first column of the array of the pixel sensing circuits corresponding to the first column ADC and a second column of the array of the pixel sensing circuits corresponding to the second column ADC, wherein the fourth column ADC and the fourth column of the array of the pixel sensing circuits corresponding to the fourth column ADC is disabled in a power saving mode.

In one embodiment, each column ADC generates a corresponding digital signal during a reset phase and a corresponding digital signal during a signal phase, wherein the digital processing circuit further generates a corresponding noise canceled digital signal by subtracting the corresponding digital signal during the reset phase from the corresponding digital signal during the signal phase; wherein during the reset phase, the corresponding analog signal is coupled to a reset level, and during the signal phase, the corresponding analog signal is controlled by a sensing element which is configured to operably sense a subject signal.

In one embodiment, the array of pixel sensing circuits are configured to capture an image.

In one embodiment, in a back-side illumination (BSI) mode, during an exposure period, a pixel sensing circuit corresponding to the first column ADC is configured to generate the first analog signal, and the pixel sensing circuit corresponding to the first column ADC is exposed to a subject signal by a shutter, and a pixel sensing circuit corresponding to the second column ADC is configured to generate the second analog signal, and the pixel sensing circuit corresponding to the second column ADC is not exposed to the subject signal by the shutter; wherein the digital processing circuit further selects the first digital count to be a noise canceled digital signal corresponding to the first column ADC.

In one embodiment, an auxiliary light source is provided for capturing the image, wherein in a comparison mode, a pixel sensing circuit corresponding to the first column ADC is exposed to the subject signal by a shutter during a first exposure period to generate the first analog signal, and a pixel sensing circuit corresponding to the second column ADC is exposed to the subject signal by the shutter during a second exposure period to generate the second analog signal, wherein an intensity of the auxiliary light source during the first exposure period is higher than an intensity of the auxiliary light source during the second exposure period; wherein the digital processing circuit further selects the first digital count to be a noise canceled digital signal corresponding to the first column ADC.

In one embodiment, the column parallel ADC circuit determines whether to enter a basic mode according a spatial characteristic of an image captured during an earlier time period, wherein in the basic mode, the first digital count corresponds to the first digital signal, and the digital processing circuit selects the first digital count to be the first digital signal and selects the second digital count to be the second digital signal.

From another perspective, the present invention provides an image sensor, configured to operably capture an image, the image sensor comprising: a column parallel analog-to-digital converter (ADC) circuit, configured to operably convert plural analog signals to respective plural digital signals; an array of pixel sensing circuits, coupled to the column parallel ADC circuit and configured to operably sense the image; the column parallel ADC circuit including: plural column ADCs, configured to operably generate respective plural digital counts, wherein the plural column ADCs include a first column ADC and a second column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and a digital processing circuit, configured to operably generate the plural digital signals, wherein the digital processing circuit generates the first digital signal according to the first digital count and the second digital signal; wherein the array of the pixel sensing circuits are formed in at least one row and plural columns corresponding to the plural column ADCs, wherein each column of the pixel sensing circuits is configured to operably generate one corresponding analog signal which is coupled to one corresponding column ADC.

From another perspective, the present invention provides an analog-to-digital (A/D) conversion method, configured to operably convert plural analog signals to respective plural digital signals, the A/D conversion method comprising: generating a first digital count according to a first analog signal; generating a second digital count according to a second analog signal, wherein the first digital count is a difference between a first digital signal and a second digital signal, wherein the first and the second digital signals correspond to the first and the second analog signals respectively; and generating the first digital signal according to the first digital count and the second digital signal.

In one embodiment, the steps of generating each of the digital counts includes: comparing the corresponding analog signal and a ramp signal to generate a corresponding comparison result; and counting to generate the corresponding digital count according to the corresponding comparison result; wherein the counting of the first digital count starts when the corresponding comparison results for counting the first digital count and counting the second digital count show that the first analog signal and the second analog signal are at different sides compared to the ramp signal.

In one embodiment, during a conversion period, when the counting of the first digital count starts to count before the level of the comparison result for counting the second digital count transits, the first digital count is counted reversely.

In one embodiment, the first digital signal is generated by summing the first digital count and the second digital signal.

In one embodiment, in a back-side illumination (BSI) mode, during an exposure period, a first pixel sensing circuit is configured to generate the first analog signal, and the first pixel sensing circuit is exposed to the image by a shutter, and a second pixel sensing circuit is configured to generate the second analog signal, and the second pixel sensing circuit is not exposed to the image by the shutter; the A/D conversion method further comprising: selecting the first digital count to be a first noise canceled digital signal.

In one embodiment, an auxiliary light source is provided for capturing the image, wherein in a comparison mode, a first pixel sensing circuit is exposed to the image by a shutter during a first exposure period to generate the first analog signal, and a second pixel sensing circuit is exposed to the image by the shutter during a second exposure period to generate the second analog signal, wherein an intensity of the auxiliary light source during the first exposure period is higher than an intensity of the auxiliary light source during the second exposure period; the A/D conversion method further comprising: selecting the first digital count to be a first noise canceled digital signal.

In one embodiment, the A/D conversion method further comprising: determining whether to enter a basic mode according a spatial characteristic of an image captured during an earlier time period; wherein in the basic mode, the first digital count corresponds to the first digital signal, the A/D conversion method comprising: selecting the first digital count to be the first digital signal; and selecting the second digital count to be the second digital signal.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1A:
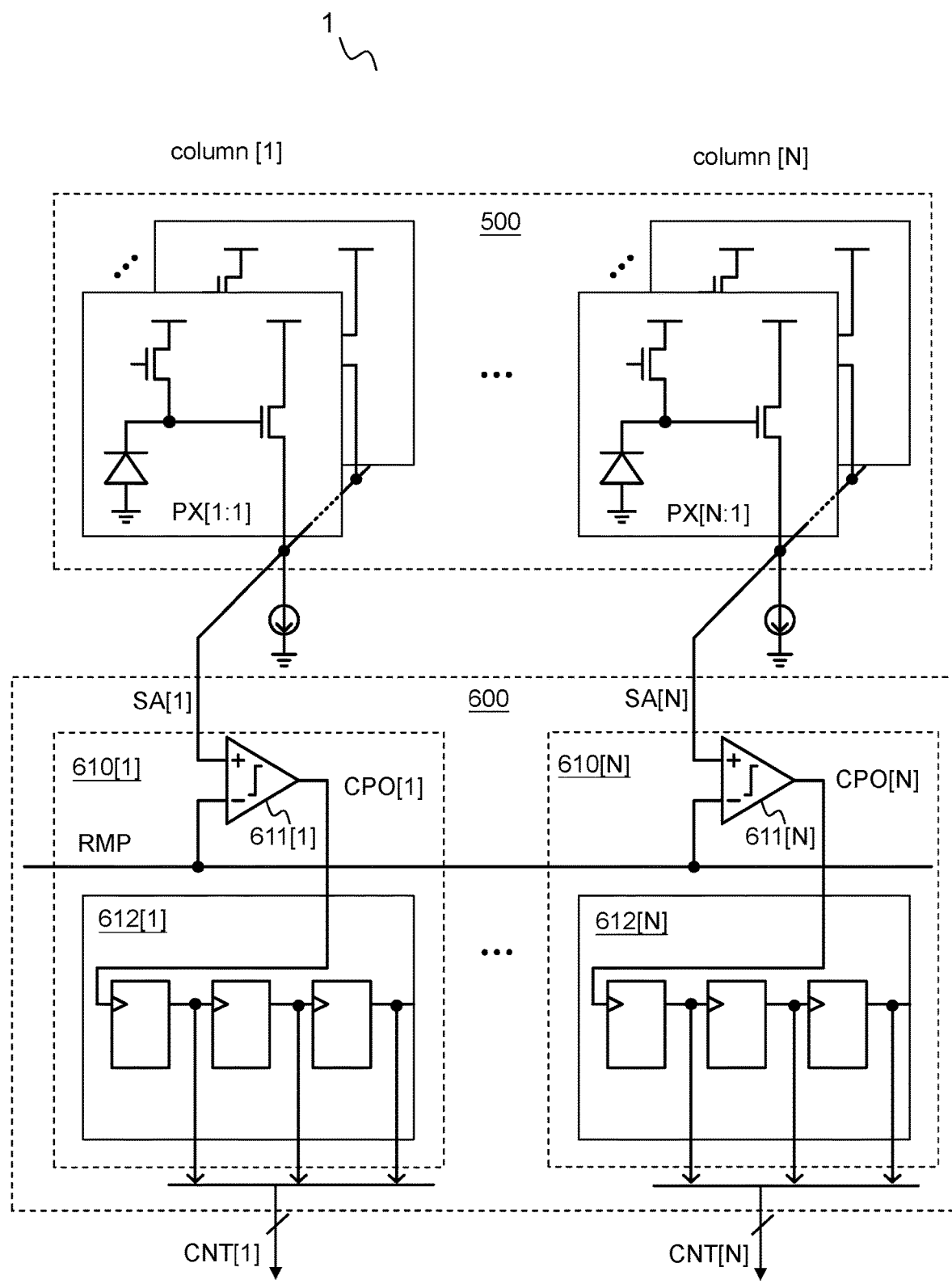
FIG. 1A shows a schematic diagram of a prior art image sensor.
Figure 1B:
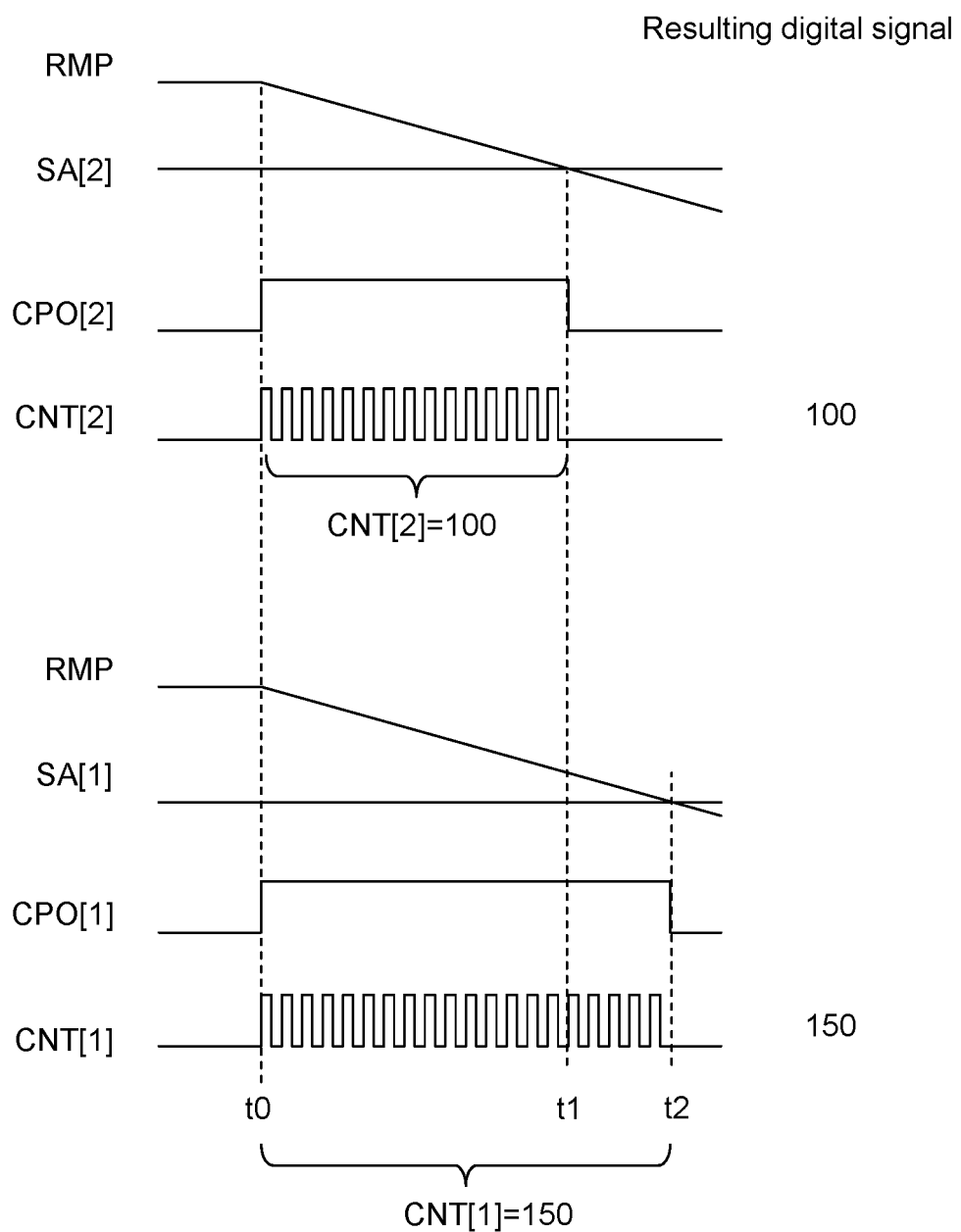
FIG. 1B shows operation waveforms corresponding to FIG. 1A.
Figure 2:
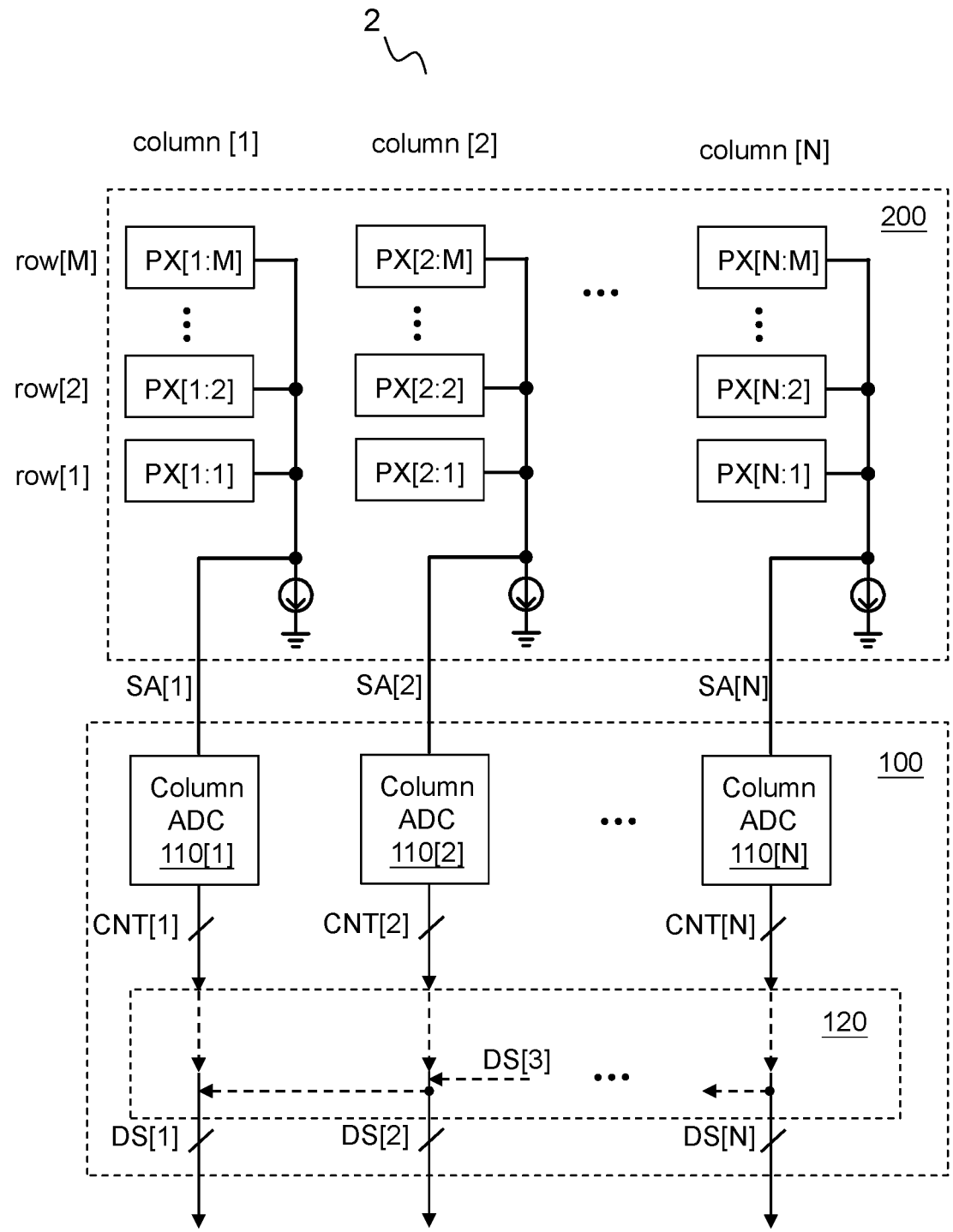
FIG. 2 shows a schematic diagram of an embodiment of the image sensor circuit and column parallel ADC circuit thereof according to the present invention.

FIG. 2 shows a schematic diagram of an embodiment of the image sensor circuit (image sensor circuit 2) and an analog-to-digital converter (ADC) circuit (column parallel ADC circuit 100) thereof according to the present invention. As shown in FIG. 2, the column parallel ADC circuit 100 is configured to operably convert plural analog signals SA[1] ~SA[N] to respective plural digital signals DS[1]~DS[N], wherein N is a positive integer larger than 1. The column parallel ADC circuit 100 comprises plural column ADCs 110[1]~110[N] and a digital processing circuit 120. The plural column ADCs 110[1]~110[N] are configured to operably generate respective plural digital counts CNT[1]~CNT[N] according to the corresponding respective plural analog signals SA[1]~SA[N]. Taking the column ADC 110[1] and the column ADC 110[2] as examples, the column ADC 110[1] generates the digital count CNT[1] according to the analog signal SA[1], and the second column ADC 110[2] generates the digital count CNT[2] according to the analog signal SA[2], wherein the digital count CNT[1] is a difference between the digital signal DS[1] and the digital signal DS[2], wherein the digital signal DS[1] and the digital signal DS[2] correspond to the analog signal SA[1] and the analog signal SA[2] respectively. In other words, the digital signal DS[1] and the digital signal DS[2] are the digital version converted from the analog signal SA[1] and the analog signal SA[2] respectively.

The digital processing circuit 120 is configured to operably generate the plural digital signals DS[1]~DS[N]. In one embodiment, as shown in FIG. 2, the digital processing circuit 120 generates the digital signal DS[1] according to the digital count CNT[1] and the digital signal DS[2].

In one embodiment, the other digital signals (e.g. DS[2]) are generated with the similar way. In summary, the digital signal DS[X] of column[X] is generated according to the digital count CNT[X] and the digital signal DS [X+1], wherein X is a positive integer smaller than N. For example, in one embodiment, the digital processing circuit 120 generates the digital signal DS[2] according to the second digital count CNT[2] and the third digital signal DS[3].

In one embodiment, the very boundary digital signal, for example DS[N] as shown in FIG. 2, corresponds to the digital count of the corresponding column ADC (CNT[N]).

According to the present invention, a digital count generated by a column ADC (for example CNT[1] generated by the column ADC 110[1]) is the difference between the digital signal DS[1] and the digital signal DS[2], which means that for generating the digital signal DS[1], the column ADC 110[1] does not have to generate a complete count corresponding to the whole range of the analog signal SA[1], and hence the power consumption for counting can be saved. From another perspective, a common mode portion of the digital signal DS[1] and digital signal DS[2] resides in the digital signal DS[2], and the column ADC 110[1] only needs to generate the digital count CNT[1] according to the differential portion between the digital signal DS[1] and digital signal DS[2].

The column parallel ADC circuit 100 can be employed in various systems, such as CCD or CMOS image sensors, temperature sensors, infra-red image sensors and other types of array of sensors which generate analog signals and require plural ADC circuits for signal conversion. The present invention provides significant advantages especially in applications wherein all columns perform signal conversions at the same time (i.e. parallel signal conversion scheme).

Still referring to FIG. 2, in one embodiment, the plural column ADCs 110[1]~110[N] are coupled to an array of pixel sensing circuits 200 which are configured to operably sense a subject signal. The subject signal can be for example but not limited to light, temperature or infra-red signals. In one embodiment, the array of pixel sensing circuits 200 are configured to capture an image. The array of pixel sensing circuits 200 are arranged in at least one row and plural columns corresponding to the plural column ADCs 110[1] ~110[N]. As shown in FIG. 2, as an example, the array of the pixel sensing circuits 200 are arranged in M rows and N columns corresponding to the N column ADCs 110[1]~110 [N], wherein M is a positive integer. Each column of the pixel sensing circuits is configured to operably generate one corresponding analog signal (e.g. SA[1]~SA[N] as shown in FIG. 2) which is coupled to one corresponding column ADC (110[1]~110[N]). In one embodiment, the signals sensed and/or stored in the pixel sensing circuit are read out row by row.

Figure 3:
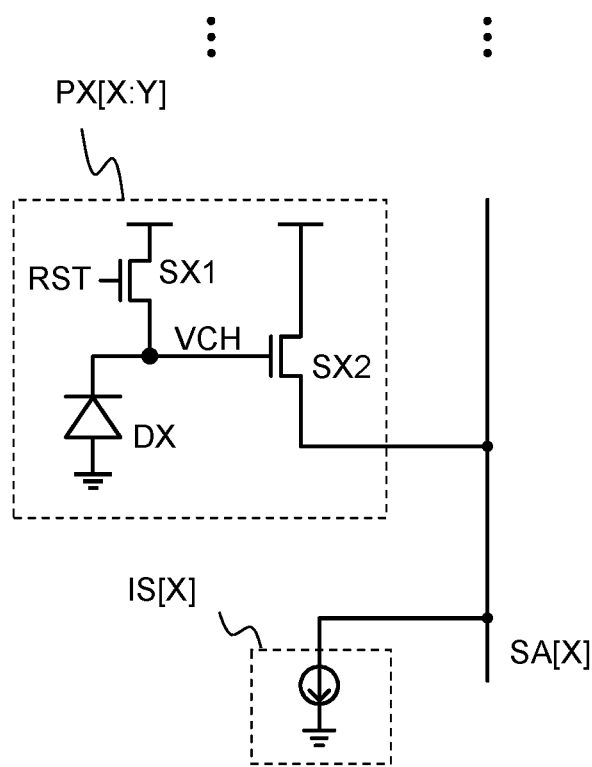
FIG. 3 shows a schematic diagram of an embodiment of the pixel sensing circuit of the image sensor circuit according to the present invention.

FIG. 3 shows a schematic diagram of an embodiment of the pixel sensing circuit of the image sensor circuit according to the present invention. In one embodiment, as shown in FIG. 3, the pixel sensing circuit PX[X:Y] includes a sensing element for sensing the subject signal (for example light), wherein X represents the column number and Y represents the row number. In one embodiment, the sensing element DX can be a photo sensitive diode. In one embodiment, the image sensor circuit PX[X:Y] includes a reset switch SX1 configured to reset the analog signal SA[X] to a reference level by as reset signal RST. In one embodiment, the image sensor circuit PX[X:Y] includes an amplifier device SX2 configured to generate the analog signal SA[X] according to the charging level VCH of the sensing element DX, wherein the charging level VCH relates to the intensity of the light.

Still referring to FIG. 3, in one embodiment, each column of the array of the pixel sensing circuits includes a bias circuit (for example the bias current IS[X] as shown in FIG. 3) to provide a bias current for generating the analog signal SA[X].

Figure 4A:
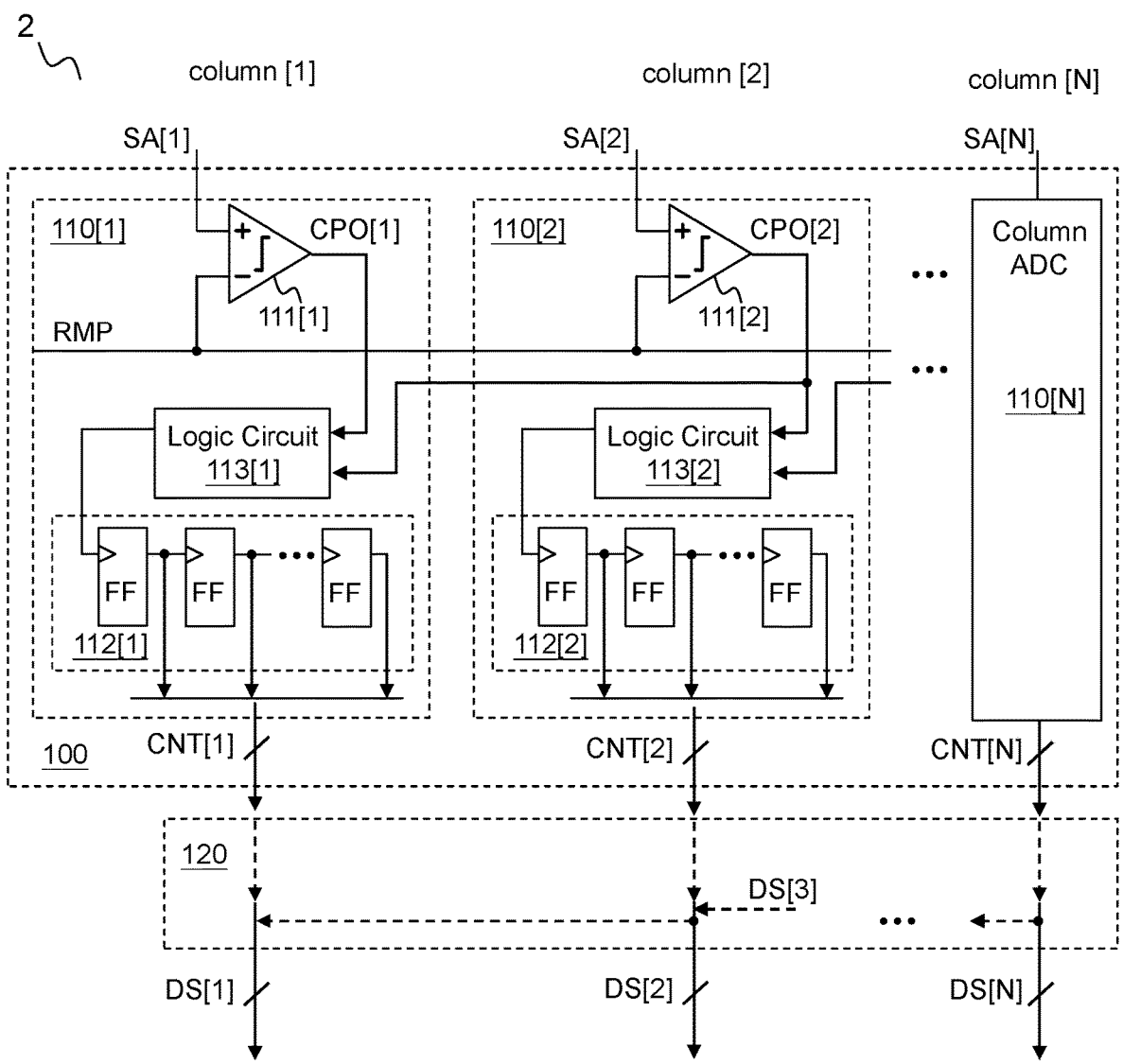
FIG. 4A shows a schematic diagram of an embodiment of the column ADC of the column parallel ADC circuit according to the present invention.
Figure 5:
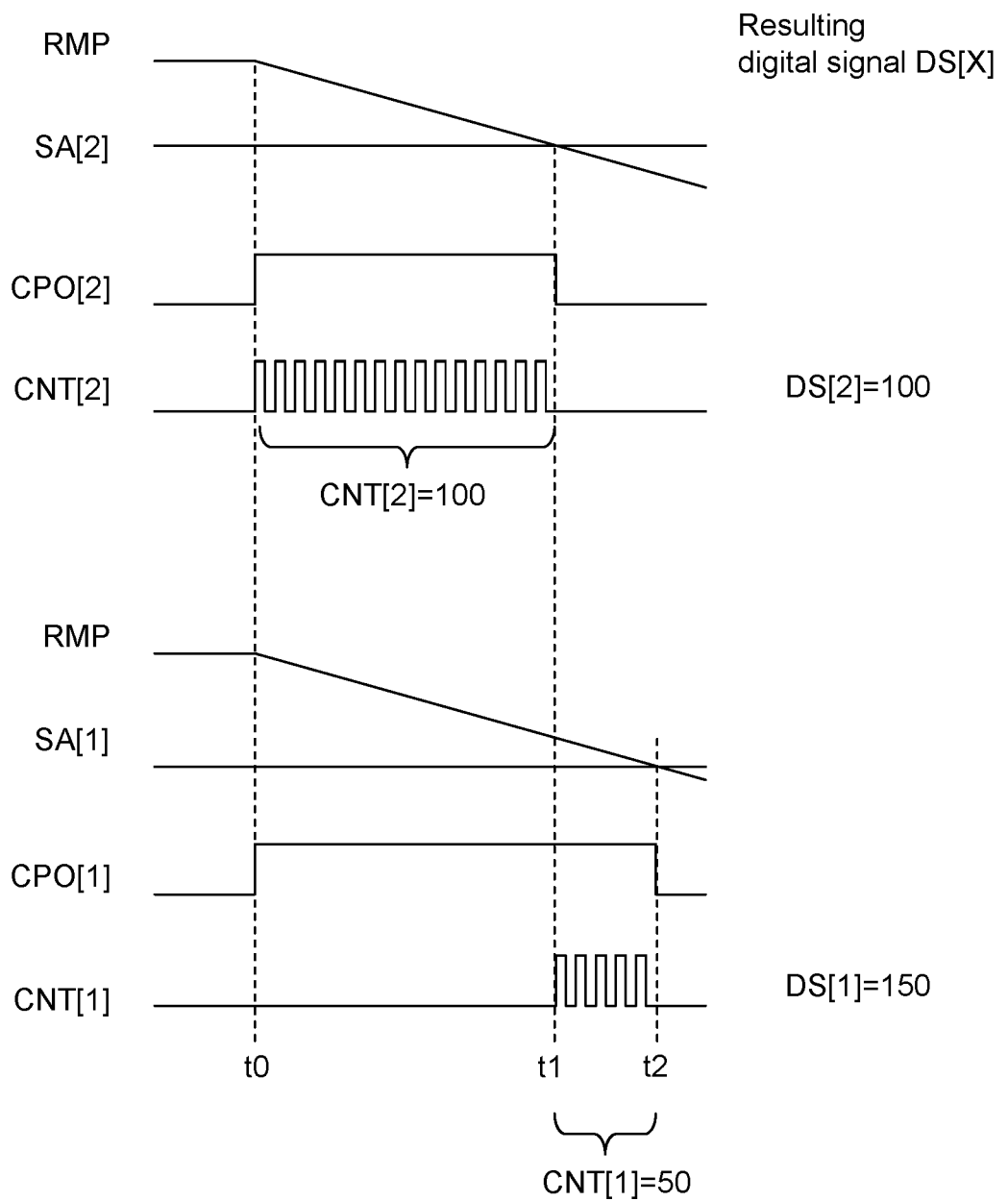
FIG. 5 shows operation waveforms corresponding to one embodiment according to the present invention.

FIG. 4A shows a schematic diagram of an embodiment of the column ADC (column ADC 110[1]110[2]) of the column parallel ADC circuit according to the present invention. FIG. 5 shows exemplary operation waveforms corresponding to FIG. 4A. As shown in FIG. 4A, in one embodiment, the column parallel ADC circuit 100 receives a ramp signal RMP. Each of the plural column ADCs (e.g. 110[1]~110[N] as shown in FIG. 4A) includes a comparator and a counter (e.g. comparator 111[1] and counter 112[1] corresponding to column [1]). Taking the comparator 111[1] of the column ADC[1] as an example, the comparator 111[1] compares the corresponding analog signal SA[1] and the ramp signal RMP to generate a corresponding comparison result signal CPO[1]. The counter 112[1] is coupled to the comparator 111[1] and is configured to operably count to generate the corresponding digital count CNT[1] according to the corresponding comparison result signal CPO[1] and the comparison result signal CPO[2]. In one embodiment, the counter 112[1] of the column ADC 110[1] starts to count to generate the digital count CNT[1] when the comparison result signal CPO[1] of the column ADC 110[1] and the comparison result signal CPO[2] of the column ADC 110[2] are different, which show that the analog signal SA[1] and the analog signal SA[2] are respectively at different sides compared to the ramp signal RMP. As described previously, the column ADC 110[1] only needs to count the differential portion of the digital signal DS[1] and digital signal DS[2]. For example, as shown in FIG. 5, the counter 110[2] starts to count from t0, while the counter 112[1] starts to count from the time point t1, instead of counting from t0 as in the prior art. Since the counter 112[1] does not have to count from t0 to t1, the power consumption for counting within this time period can be saved. In other words, since the counter does not have to count a complete count for the whole digital signal DS[1] (corresponding to the whole analog signal SA[1]), but only needs to count the difference between the digital signal DS[1] and digital signal DS[2], the power for counting can be saved.

Note that in FIG. 5, only the least significant bits of the digital counts (e.g. CNT[1] and CNT[2]) are shown for illustrating the counting operation.

Also note that the counter shown in FIG. 4A is referred to as a "ripple counter" (including plural chained flip-flops FF) which is only for illustrative purpose but not for limiting the scope of the present invention. In other embodiments, the counter can be embodied in other structures, such as a synchronous counter, and etc.

Still referring to FIG. 4A, in one embodiment, the logic circuit (e.g. 113[1]) determines whether the analog signal SA[1] and the analog signal SA[2] are at different sides compared to the ramp signal RMP. In one embodiment, the logic circuit 113[1] includes an XOR gate to perform the aforementioned logic operation.

Figure 4B:
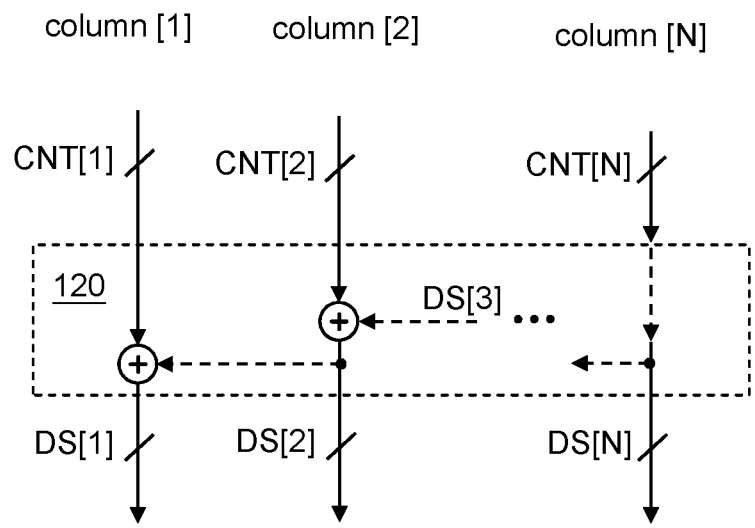
FIG. 4B shows a schematic diagram of an embodiment of the digital processing circuit of the column parallel ADC circuit according to the present invention.

FIG. 4B shows a schematic diagram of an embodiment of the digital processing circuit of the column parallel ADC circuit according to the present invention. From another perspective, in one embodiment, the digital signal DS[1] is generated by summing the digital count CNT[1] of the column ADC 110[1] and the digital signal DS[2] as shown in FIG. 4B and FIG. 5. For example, if the digital signal DS[1] corresponding to the analog signal SA[1] is 150 and the digital signal DS[2] corresponding to the analog signal SA[2] is 100, according to the present invention, the column ADC 110[1] only has to count a number "50" to generate the digital count CNT[1], instead of 150, which saves power for counting. The counting scheme described above can be referred to as a "power improvement mode".

Note that in image sensor applications, there is a high possibility that the analog signal levels of adjacent columns are similar. In this case, the present invention can save tremendous power. In one preferred embodiment, a column of the array of the pixel sensing circuits 200 corresponding to the aforementioned column ADC 110[1] (i.e. column [1]) is arranged geometrically neighboring to a column of the array of the pixel sensing circuits 200 corresponding to the aforementioned column ADC 110[2] (i.e. column [2]), so that the common mode portion of the digital signal DS[1] and digital signal DS[2] can be saved when counting for generating the digital count CNT[1], since in most cases the image patterns of these two columns are similar. According to experimental results, the power consumption of all the counters of the column parallel ADC circuit can be saved up to 50% when sensing a white noise image, and up to 99% when sensing a uniform image.

Figure 6:
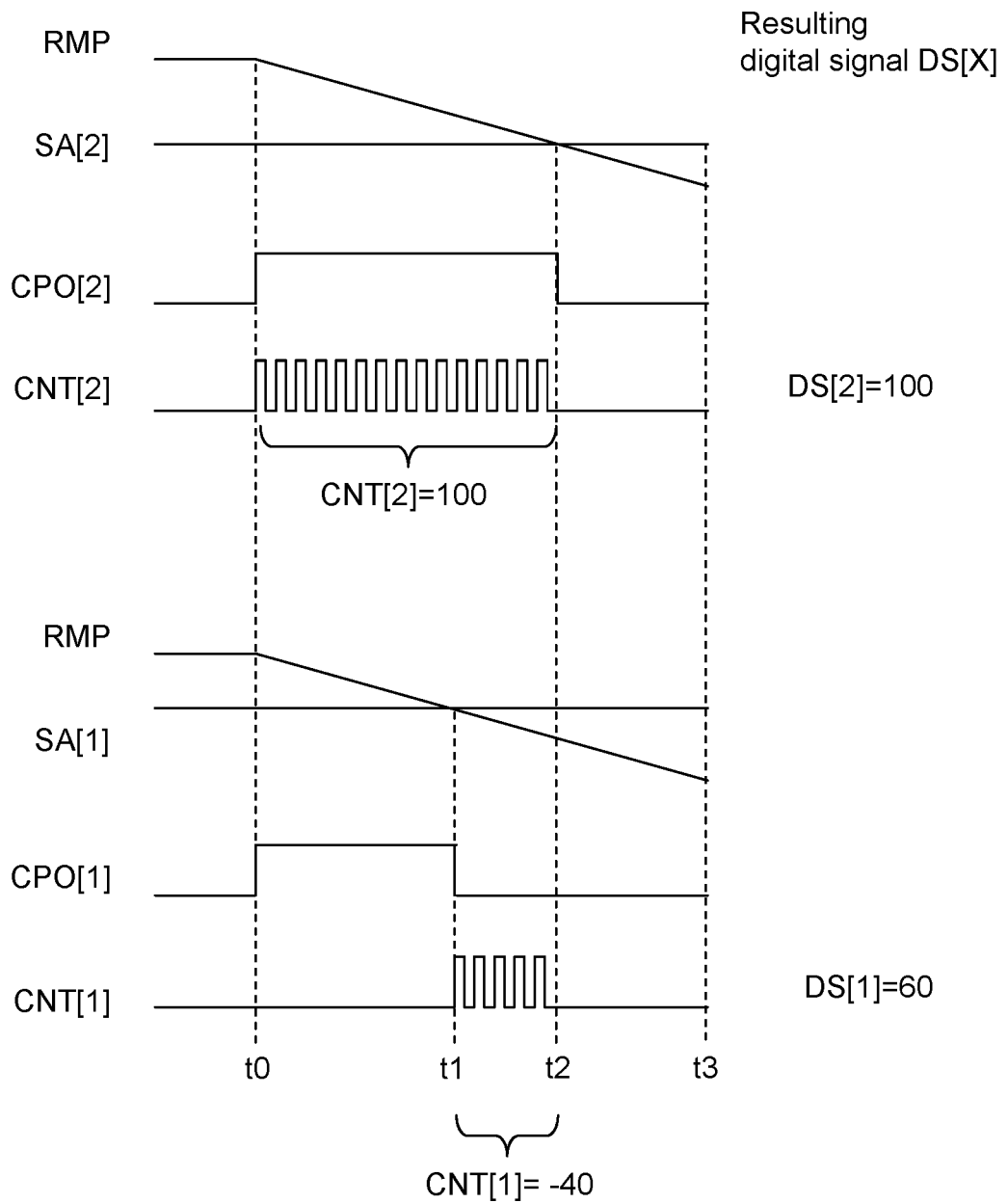
FIG. 6 shows operation waveforms corresponding to one embodiment according to the present invention.

FIG. 6 shows operation waveforms corresponding to one embodiment according to the present invention. In this embodiment, the digital signal DS[1] is smaller than the digital signal DS[2]. In this case, during a conversion period (e.g. from time point t0 to t3), the time point when the analog signal SA[1] and the analog signal SA[2] starts to be at different sides compared to the ramp signal RMP (i.e. t1 as shown in FIG. 6) occurs before the end of counting the digital count CNT[2] (i.e. t2 as shown in FIG. 6). That is to say, the counter 112[1] of the column ADC 110[1] will start to count (i.e. t1) before the level of the comparison result signal CPO[2] of the column ADC 110[2] circuit transits from high to low (i.e. t2). In one preferred embodiment, as shown in FIG. 6, when the counter 112[1] of the column ADC 110[1] starts to count before the level of the comparison result signal CPO[2] of the column ADC 110[2] transits, the counter 112[1] of the column ADC 110[1] counts reversely. For example, as shown in FIG. 6, the counter 112[2] (CNT[2]) of the column ADC 110[2] starts to count first (t0), and when CNT[2] counts to 60 (t1), the ramp signal RMP intersects the level of the analog signal SA[1], and the counter 112[1] (CNT[1]) of the column ADC 110[1] will start to count (t1) and count reversely, for example to count a negative number (for example −40 at t2 as shown in FIG. 6), till when the analog signal SA[1] and the analog signal SA[2] become at the same side compared to the ramp signal RMP again (i.e. t2 in FIG. 6, corresponding to the end of the CNT[2]). Note that the final result of the digital signal DS[1] is still equal to the sum of the digital signal DS[2] and the digital count CNT[1]. For example, as shown in FIG. 6, the digital signal DS[2] (equal to CNT[2] as an example) is 100, and the digital count CNT[1] is −40. Therefore, the digital signal DS[1] is 100+(−40), which equals to 60.

Figure 7:
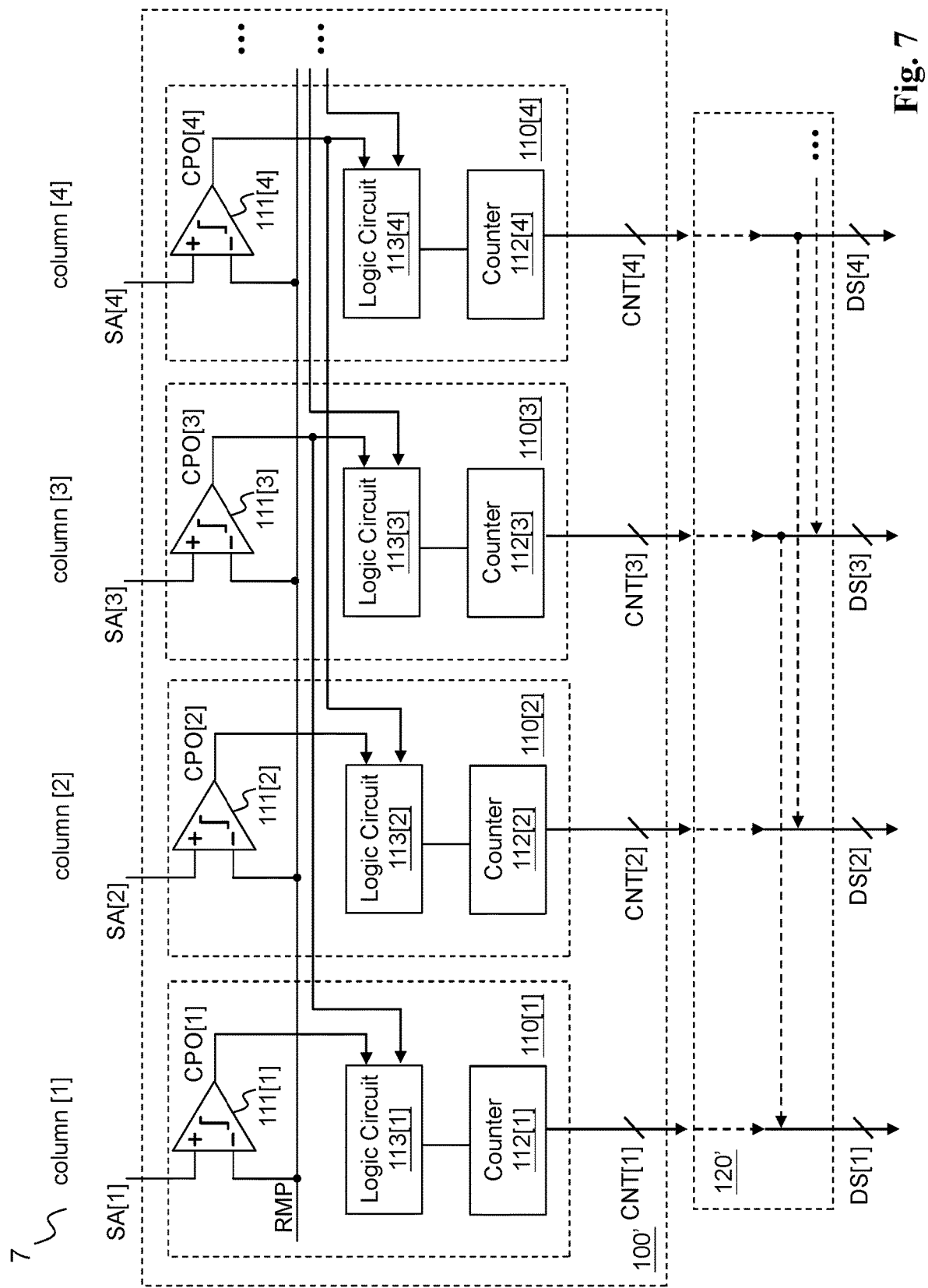
FIG. 7 shows a schematic diagram of an embodiment of the column parallel ADC circuit according to the present invention.

FIG. 7 shows a schematic diagram of an embodiment of the column parallel ADC circuit according to the present invention. As shown in the column parallel ADC circuit 100' and the digital processing circuit 120' in FIG. 7, in one embodiment, geometrically every other column ADCs are correlated. For example, as shown in FIG. 7, the counter 112[1] depends on the comparison output signals CPO[1] and CPO[3], and the digital signal DS[1] is generated according to the digital signal DS[3] and the digital count CNT[1]; likewise, the digital signal DS[2] is generated according to the digital signal DS[4] and the digital count CNT[2], etc. In this preferred embodiment, the interlaced arrangement of the column ADCs allows for example the even numbered column ADCs (for example 110[2], 110[4] . . . ) to be disabled for saving power in a power saving mode, while the odd numbered column ADCs (for example 110[1], 110[3] . . . ) keeps operating.

Note that the geometrical arrangement of the array of the pixel sensing circuits corresponding to the related column ADCs is not limited to the aforementioned examples, i.e., columns being sequentially neighboring or interlaced, and can be arranged in other proper structures according to the requirements.

Figure 8A:
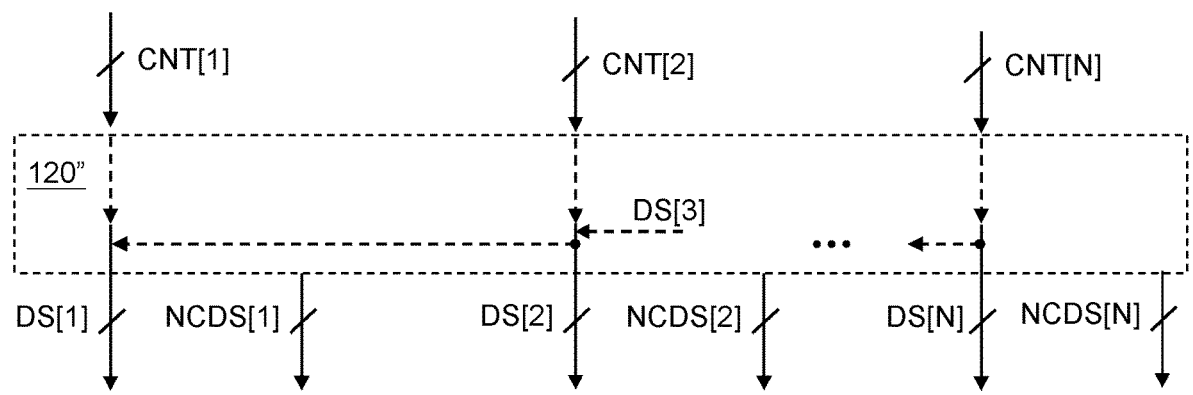
FIG. 8A shows a schematic diagram of an embodiment of the digital processing circuit of the column parallel ADC circuit according to the present invention.
Figure 8B:
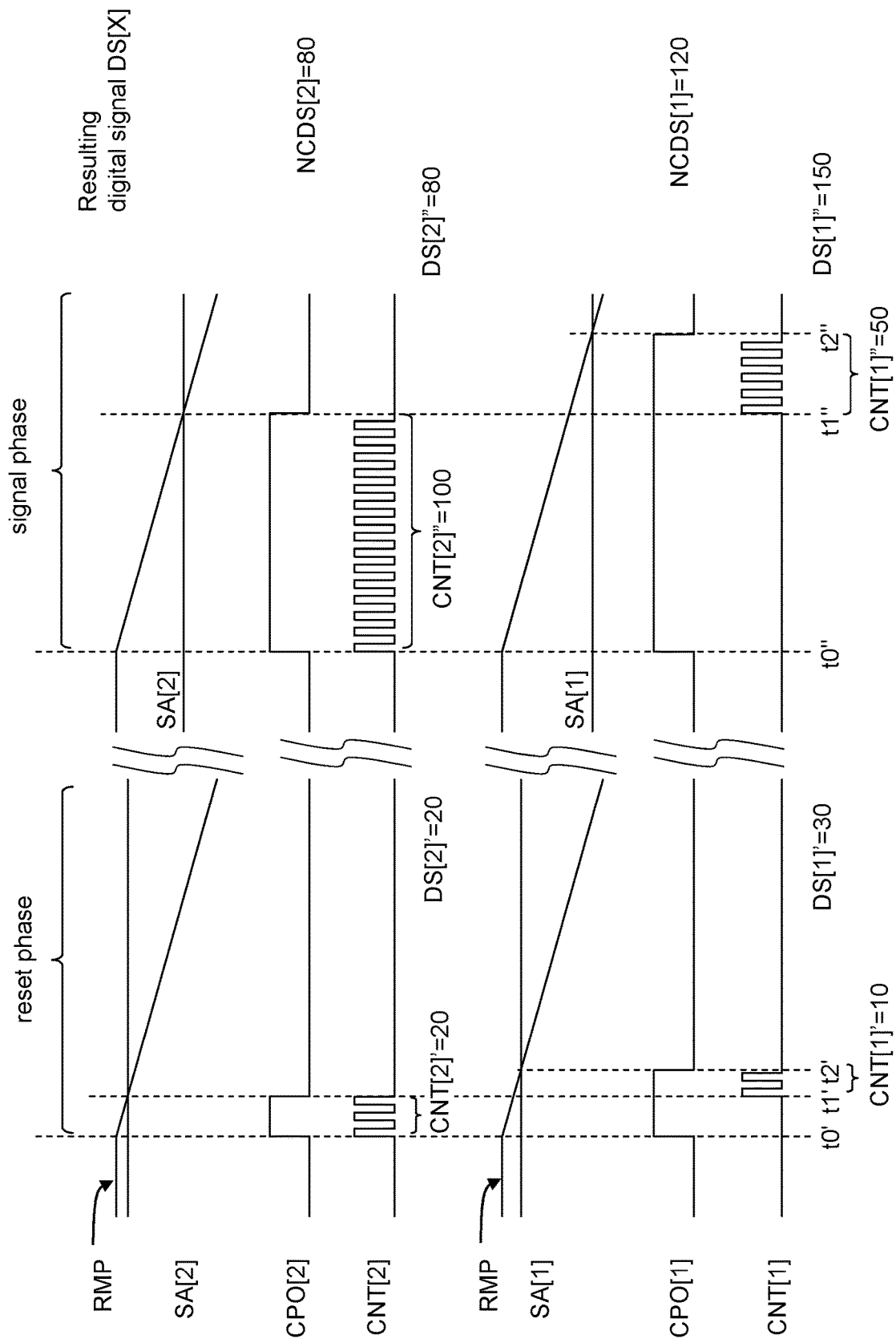
FIG. 8B shows operation waveforms corresponding to one embodiment according to the present invention.

FIG. 8A shows a schematic diagram of an embodiment of the digital processing circuit of the column parallel ADC circuit according to the present invention. FIG. 8B shows operation waveforms corresponding to one embodiment according to the present invention corresponding to FIG. 8A. In one embodiment, the column parallel ADC circuit 100 can support conversions including a reset phase and a signal phase. As shown in FIG. 8B, the column ADC 110[1] generates a digital signal DS[1]' during the reset phase and a corresponding digital signal DS[1]" during a signal phase. Note that the generation of the digital signals DS[1]' and DS[1]" are similar to the generation of the aforementioned digital signal DS[1].

In this embodiment, as shown in FIG. 8A and FIG. 8B, the digital processing circuit 120" further generates a noise canceled digital signal NCDS[1] by subtracting the digital signal DS[1]' during the reset phase from the digital signal DS[1]" during the signal phase. During the reset phase, the analog signal SA[1] is coupled to a reset level (for example by turning ON the reset switch SX1 as shown in FIG. 3). During the signal phase, the analog signal SA[1] is controlled by a sensing element (for example the sensing element DX as shown in FIG. 3) which is configured to sense a subject signal (for example an image). More specifically, during the reset phase, the digital signal DS[1]' is generated according to the digital count CNT[1]' and the digital signal DS[2]', while during the signal phase, the digital signal DS[1]" is generated according to the digital count CNT[1]" and the digital signal DS[2]".

Still referring to FIG. 8B, as an example, the digital signal DS[2]' during the reset phase is 20, and the digital count CNT[1]' during the reset phase is 10; hence the digital signal DS[1]' during the reset phase is 30 (i.e. 20+10). The digital signal DS[2]" during the signal phase is 100, and the digital count CNT[1]" during the signal phase is 50; hence the digital signal DS[1]" during the signal phase is 150 (i.e. 100+50). Therefore, the noise canceled digital signal NCDS[1] is 120 (i.e. 150−30).

In the aforementioned processing operation, the noise canceled digital signal NCDS[1] is equal to (DS[2]"+CNT[1]")−(DS[2]'+CNT[1]'). In a preferred embodiment, all the subtracted items (i.e. DS[2]' and CNT[1]') can be arranged to be counted reversely for simpler logic operation by the digital processing circuit 120.

Back-side illumination (BSI) mode is a novel technique often employed in image sensors for improving low-light performance, especially in CMOS image sensors. However, BSI mode has a side effect that it also introduces more and higher noises and hence requires noise cancellation. A typical noise cancelation method to solve this issue is to subtract a reference signal from the sensed signal; however, this requires more column ADCs for converting the reference signals and causes higher power consumption. With the present invention, such power consumption can be greatly reduced in BSI mode.

Figure 9:
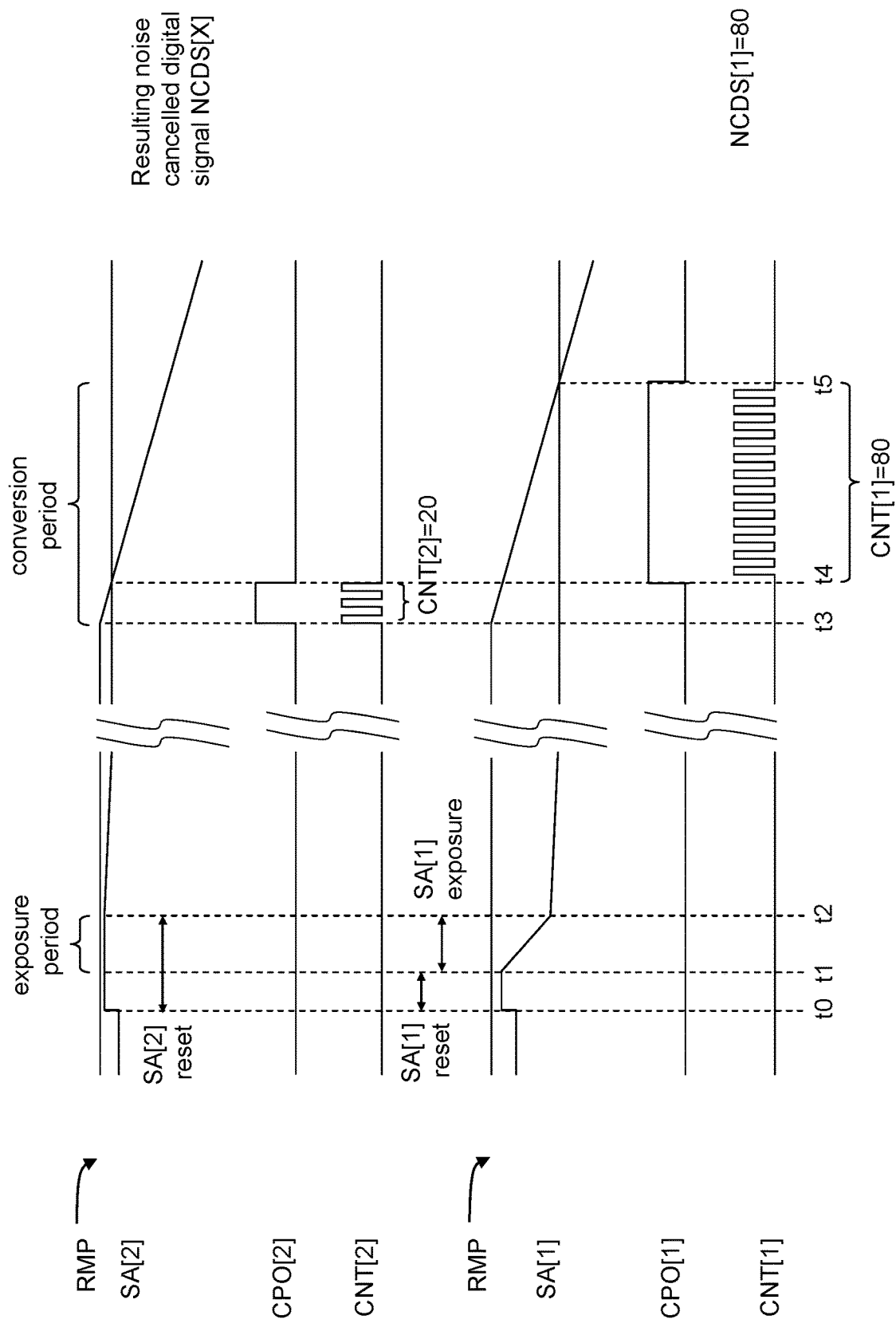
FIG. 9 shows operation waveforms corresponding to one embodiment according to the present invention.

FIG. 9 shows operation waveforms corresponding to one embodiment according to the present invention. Also referring to FIG. 2, in one embodiment, in a back-side illumination (BSI) mode, during an exposure period (e.g. t1~t2 in FIG. 9) for exposing a row of the array of the pixel sensing circuits, a pixel sensing circuit (for example PX[1:1] of column [1] as shown in FIG. 2) corresponding to the column ADC 110[1] is configured to generate the analog signal SA[1], and the pixel sensing circuit PX[1:1] is exposed to the subject signal (i.e. the image) by a shutter. In this embodiment, a pixel sensing circuit (for example PX[2:1] of column [2] as shown in FIG. 2) corresponding to the column ADC 110[2] is configured to generate the analog signal SA[2], and the pixel sensing circuit PX[2:1] is not exposed to the subject signal by the shutter. More specifically, in one embodiment, during the exposure period, the pixel sensing circuit PX[2:1] is configured to a reset state as in the reset phase described earlier, as indicated by "SA[2] reset" in FIG. 9. Note that though the pixel sensing circuit PX[2:1] is not exposed to the subject signal by the shutter, both pixel sensing circuits PX[1:1] and PX[2:1] are exposed to the "darkness" (or actual environmental noise) after the shutter is closed.

Figure 11A:
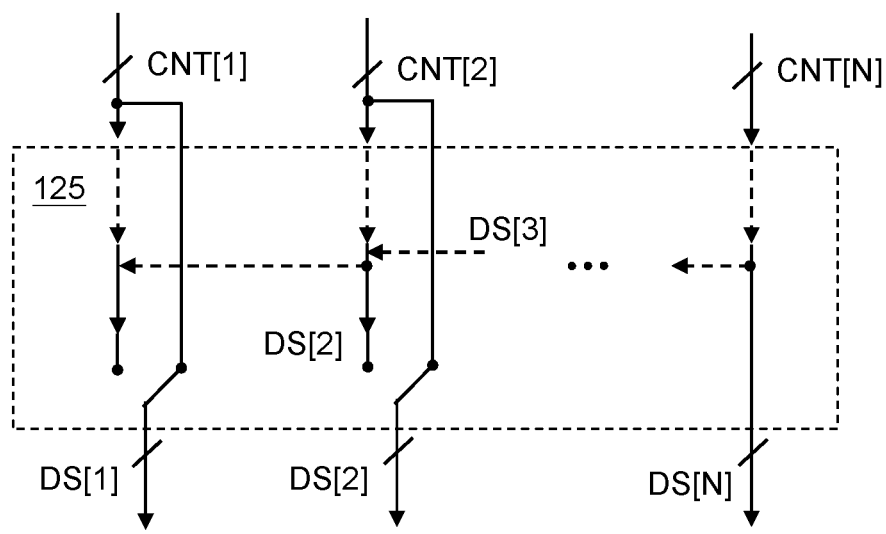
FIG. 11A shows a schematic diagram of an embodiment of the column parallel ADC circuit according to the present invention.

In this embodiment, the digital processing circuit 125 (as shown in FIG. 11A) further selects the digital count CNT[1] (e.g. 80 as shown in FIG. 9) to be a noise canceled digital signal NCDS[1] (i.e. 80) corresponding to the first column ADC 110[1].

Note that, in this embodiment, the pixel sensing circuit PX[2:1] corresponds to the "reference" (i.e. corresponding to the SA[2]) and the pixel sensing circuit PX[1:1] corresponds to the "sensed signal" (i.e. corresponding to the SA[1]), as mentioned earlier. Still referring to FIG. 9, since the digital count CNT[1] (i.e. 80) is the difference between the digital signal DS[1] (i.e. 100) and the digital signal DS[2] (i.e. 20), the digital count CNT[1] is the "signal" minus the "reference". And hence the digital count CNT[1] can be selected as the noise canceled digital signal NCDS[1] (i.e. 80).

Comparison mode is another novel technique for enhancing quality of images or for better focusing. Taking focusing as an example, in a prior art comparison mode, two frames are captured with a short time difference, usually one with an auxiliary light source and the other without the light source, and these two frames are compared to obtain information for focusing. However, it requires to do the image capture and signal conversion two times and hence the power consumption is doubled. With the present invention, the power consumption can also be greatly reduced in comparison mode.

Figure 10:
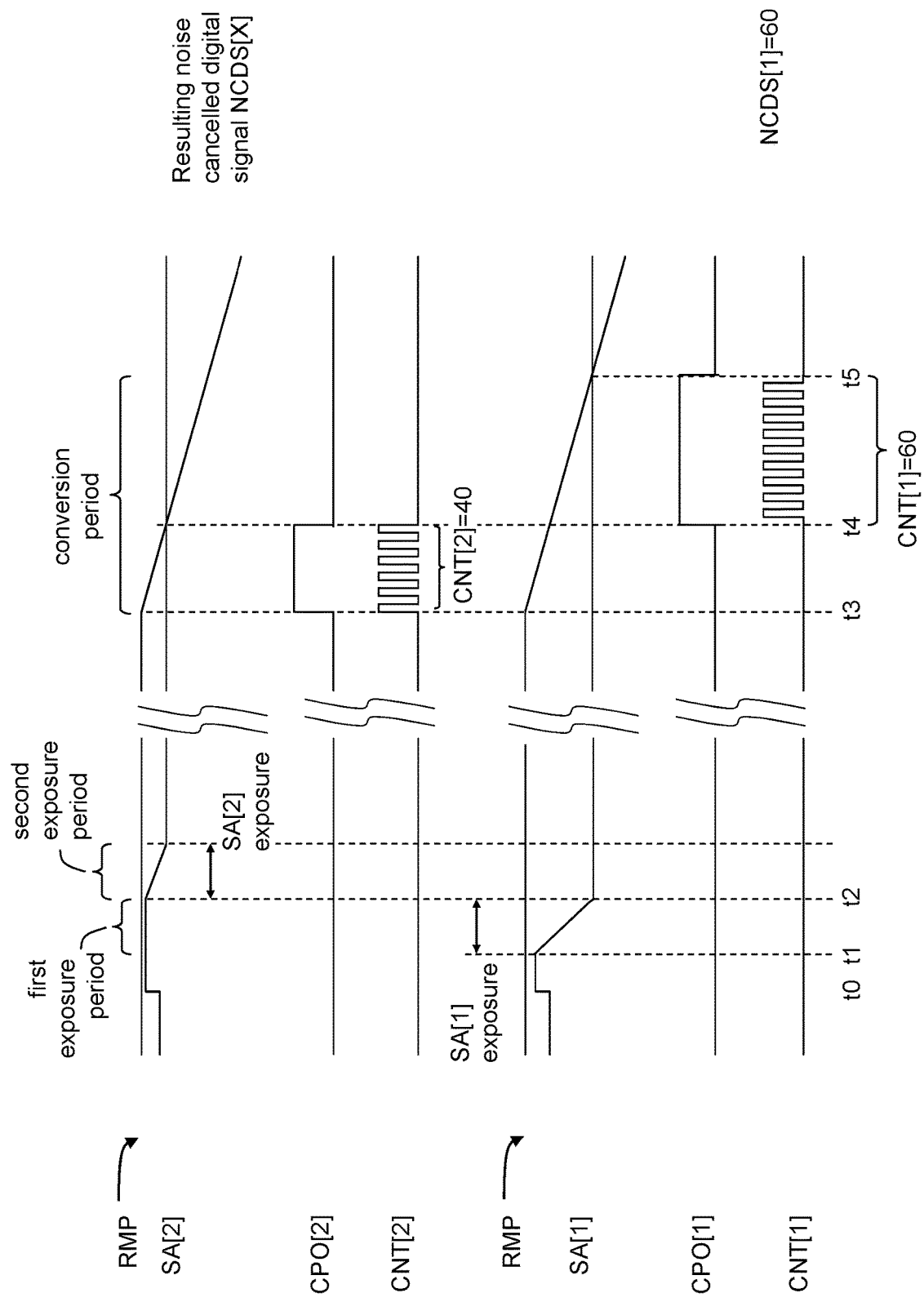
FIG. 10 shows operation waveforms corresponding to one embodiment according to the present invention.

FIG. 10 shows operation waveforms corresponding to one embodiment according to the present invention.

In this embodiment, an auxiliary light source is provided for capturing the image. In a comparison mode, a pixel sensing circuit (for example PX[1:1] shown in FIG. 2) corresponding to the column ADC 110[1] is exposed to the image by a shutter during a first exposure period, to generate the first analog signal SA[1]. A pixel sensing circuit (for example PX[2:1] shown in FIG. 2) corresponding to the column ADC 110[2] is exposed to the image by the shutter during a second exposure period, to generate the analog signal SA[2]. Note that, in this embodiment, pixel sensing circuits PX[1:1] and PX[2:1] are at the same row (row [1]). In one embodiment, the time difference between the first exposure period and the second exposure period is short to an extent that the images of the first and the second exposure period are similar except the light source. In one preferred embodiment, as shown in FIG. 10, both the first and the second exposure period are within a single read-out period. In this embodiment, the intensity of the auxiliary light source during the first exposure period is higher than the intensity of the auxiliary light source during the second exposure period. In one preferred embodiment, the auxiliary light source is ON during the first exposure period and the auxiliary light source is OFF during the second exposure period. In this embodiment, the digital processing circuit 125 (as shown in FIG. 11A) further selects the first digital count CNT[1] to be a noise canceled digital signal NCDS[1] corresponding to the first column ADC 110[1].

More specifically, in one embodiment, both the analog signals SA[1] and SA[2] are obtained by corresponding sample and hold circuits which samples and holds the signals sensed by the pixel sensing circuit PX[1:1] and PX[2:1] after the first and the second exposure periods, respectively. In one embodiment, after respective exposure period and after the sensed signal is sampled-and-held, the respective pixel sensing circuit can be configured to the reset state as described earlier.

Note that, in this embodiment, the pixel sensing circuit PX[2:1] corresponds to the "reference" (i.e. corresponding to the SA[2]) and the pixel sensing circuit PX[1:1] corresponds to the "sensed signal" (i.e. corresponding to the SA[1]) for focusing information. Still referring to FIG. 10, since the digital count CNT[1] (e.g. 60) is the difference between the digital signal DS[1] (i.e. 100) and the digital signal DS[2] (i.e. 40), the digital count CNT[1] is the "signal" minus the "reference". And hence the digital count CNT[1] can be selected as the noise canceled digital signal NCDS[1] (i.e. 60) as shown in FIG. 10.

Figure 11B:
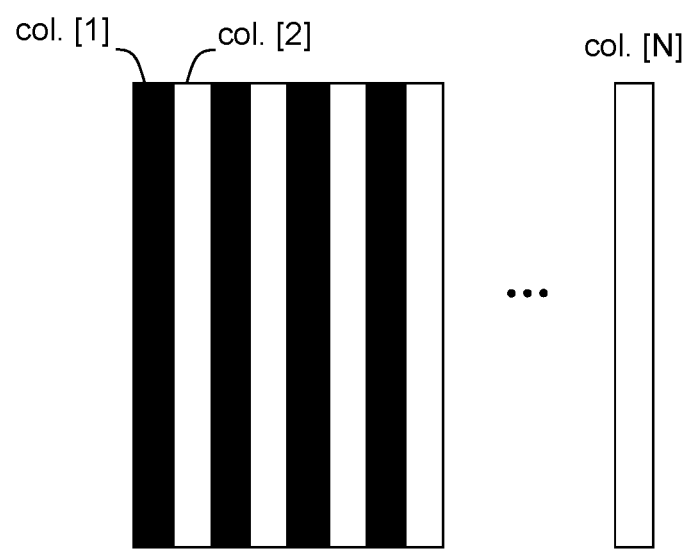
FIG. 11B shows a high contrast image pattern.

FIG. 11A shows a schematic diagram of an embodiment of the digital processing circuit (digital processing circuit 125) of the column parallel ADC circuit according to the present invention. FIG. 11B shows a high contrast image pattern. For some certain image patterns, such as the pattern shown in FIG. 11B, the aforementioned power reduction mechanism proposed by the present invention may not reduce the power consumption so much as expected due to the high contrast between neighboring columns. However, according to the present invention, the circuitry and counting scheme described above (e.g. FIG. 2 and FIG. 5) are optional and can be configured to a basic mode when necessary. In one embodiment, the column parallel ADC circuit 100 determines whether to enter a basic mode according a spatial characteristic of an image captured during an earlier time period. There is a high possibility, especially for a moving video, that the current frame has similar spatial characteristic (for example spatial frequency characteristic) with the earlier frames. Hence, in one embodiment, when the spatial characteristic of a previous frame is determined to be for example high contrast, the counting scheme can be adaptively changed to the basic mode. In the basic mode, as shown in FIG. 11A, the digital count CNT[1] corresponds to the first digital signal DS[1], and the digital processing circuit 125 selects the digital count CNT[1] to be the digital signal DS[1] and selects the digital count CNT[2] to be the digital signal DS[2]. More specifically, in the basic mode, the counter 112[1] of the column ADC[1] (as shown in FIG. 2) starts to count as the ramp signal RMP begins to ramp. In other words, in the basic mode, the counter 112[1] of the column ADC[1] counts the complete count corresponding the analog signal SA[1]. From another perspective, in the comparison mode, the logic circuit (e.g. the logic circuit 113[1] as shown in FIG. 2) masks the comparison result signal CPO[2] of the column ADC 110[2] and the operation depends on the comparison result signal CPO[1] of the column ADC 110[1] only. The adaptive entry to the basic mode further improves the power consumption based on the spirit of the present invention.

In summary, according to the present invention, in the power improvement mode, the column parallel ADC circuit can save the power consumption by counting the differential portion of neighboring signals only, instead of counting the complete analog signal. The power improvement mode can be employed with other different modes of operations, such as the reset/signal phases, the BSI mode, the comparison mode and the basic mode.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A column parallel analog-to-digital converter (ADC) circuit, configured to operably convert plural analog signals to respective plural digital signals, the column parallel ADC circuit comprising:

plural column ADCs, configured to operably generate respective plural digital counts, wherein the plural column ADCs include a first column ADC and a second column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and a digital processing circuit, configured to operably generate the plural digital signals, wherein the digital processing circuit generates the first digital signal according to the first digital count and the second digital signal;

wherein the column parallel ADC circuit receives a ramp signal, wherein each of the plural column ADCs includes:
  a comparator, configured to operably compare the corresponding analog signal and the ramp signal to generate a corresponding comparison result signal; and
  a counter, coupled to the comparator and configured to operably count to generate the corresponding digital count according to the corresponding comparison result signal;
  wherein the counter of the first column ADC starts to count to generate the first digital count when the comparison result signals of the first column ADC and the second column ADC show that the first analog signal and the second analog signal are at different sides compared to the ramp signal;
  wherein during a conversion period, when the counter of the first column ADC starts to count before the level of the comparison result signal of the second column ADC transits, the counter of the first column ADC counts reversely.

2. The column parallel ADC circuit of claim 1, wherein the second digital signal corresponds to the second digital count.

3. The column parallel ADC circuit of claim 1, wherein the plural column ADCs include a third column ADC, wherein
  the third column ADC is configured to operably generate a third digital count according to a third analog signal, wherein the second digital count is a difference between the second digital signal and a third digital signal, wherein the third digital signal corresponds to the third analog signals; and
  the digital processing circuit generates the second digital signal according to the second digital count and the third digital signal.

4. The column parallel ADC circuit of claim M, wherein the first digital signal is generated by summing the first digital count and the second digital signal.

5. The column parallel ADC circuit of claim 1, wherein the plural column ADCs are coupled to an array of pixel sensing circuits which are configured to operably sense a subject signal, and the array of the pixel sensing circuits are formed in at least one row and plural columns corresponding to the plural column ADCs, wherein each column of the pixel sensing circuits is configured to operably generate one corresponding analog signal which is coupled to one corresponding column ADC.

6. The column parallel ADC circuit of claim 5, wherein a first column of the array of the pixel sensing circuits corresponding to the first column ADC is arranged geometrically neighboring to a second column of the array of the pixel sensing circuits corresponding to the second column ADC.

7. The column parallel ADC circuit of claim 5, wherein the array of pixel sensing circuits are configured to capture an image.

8. The column parallel ADC circuit of claim 1, wherein each column ADC generates a corresponding digital signal during a reset phase and a corresponding digital signal during a signal phase, wherein the digital processing circuit further generates a corresponding noise canceled digital signal by subtracting the corresponding digital signal during the reset phase from the corresponding digital signal during the signal phase;

wherein during the reset phase, the corresponding analog signal is coupled to a reset level, and during the signal phase, the corresponding analog signal is controlled by a sensing element which is configured to operably sense a subject signal.

9. A column parallel analog-to-digital converter (ADC) circuit, configured to operably convert plural analog signals to respective plural digital signals, the column parallel ADC circuit comprising:
  plural column ADCs, configured to operably generate respective plural digital counts, wherein the plural column ADCs include a first column ADC, a second column ADC and a fourth column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and
  a digital processing circuit, configured to operably generate the plural digital signals, wherein the digital processing circuit generates the first digital signal according to the first digital count and the second digital signal;
  wherein the plural column ADCs are coupled to an array of pixel sensing circuits which are configured to operably sense a subject signal, and the array of the pixel sensing circuits are formed in at least one row and plural columns corresponding to the plural column ADCs, wherein each column of the pixel sensing circuits is configured to operably generate one corresponding analog signal which is coupled to one corresponding column ADC;
  wherein a fourth column of the array of the pixel sensing circuits corresponding to the fourth column ADC is arranged geometrically in between a first column of the array of the pixel sensing circuits corresponding to the first column ADC and a second column of the array of the pixel sensing circuits corresponding to the second column ADC, wherein the fourth column ADC and the fourth column of the array of the pixel sensing circuits corresponding to the fourth column ADC is disabled in a power saving mode.

10. A column parallel analog-to-digital converter (ADC) circuit, configured to operably convert plural analog signals to respective plural digital signals, the column parallel ADC circuit comprising:
  plural column ADCs, configured to operably generate respective plural digital counts, wherein the plural column ADCs include a first column ADC and a second column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and
  a digital processing circuit, configured to operably generate the plural digital signals, wherein the digital processing circuit generates the first digital signal according to the first digital count and the second digital signal;

wherein the plural column ADCs are coupled to an array of pixel sensing circuits which are configured to operably sense a subject signal, and the array of the pixel sensing circuits are formed in at least one row and plural columns corresponding to the plural column ADCs, wherein each column of the pixel sensing circuits is configured to operably generate one corresponding analog signal which is coupled to one corresponding column ADC;

wherein the column parallel ADC circuit operates in one of the following modes:

(1) wherein in a back-side illumination (BSI) mode, during an exposure period, a pixel sensing circuit corresponding to the first column ADC is configured to generate the first analog signal, and the pixel sensing circuit corresponding to the first column ADC is exposed to a subject signal by a shutter, and a pixel sensing circuit corresponding to the second column ADC is configured to generate the second analog signal, and the pixel sensing circuit corresponding to the second column ADC is not exposed to the subject signal by the shutter;

wherein the digital processing circuit further selects the first digital count to be a noise canceled digital signal corresponding to the first column ADC;

(2) wherein an auxiliary light source is provided for capturing an image, wherein in a comparison mode, a pixel sensing circuit corresponding to the first column ADC is exposed to the subject signal by a shutter during a first exposure period to generate the first analog signal, and a pixel sensing circuit corresponding to the second column ADC is exposed to the subject signal by the shutter during a second exposure period to generate the second analog signal, wherein an intensity of the auxiliary light source during the first exposure period is higher than an intensity of the auxiliary light source during the second exposure period;

wherein the digital processing circuit further selects the first digital count to be a noise canceled digital signal corresponding to the first column ADC; or (3) wherein the column parallel ADC circuit determines whether to enter a basic mode according a spatial characteristic of an image captured during an earlier time period, wherein in the basic mode, the first digital count corresponds to the first digital signal, and the digital processing circuit selects the first digital count to be the first digital signal and selects the second digital count to be the second digital signal.

11. An image sensor, configured to operably capture an image, the image sensor comprising:

a column parallel analog-to-digital converter (ADC) circuit, configured to operably convert plural analog signals to respective plural digital signals; and an array of pixel sensing circuits, coupled to the column parallel ADC circuit and configured to operably sense the image;

the column parallel ADC circuit including:

plural column ADCs, configured to operably generate respective plural digital counts, wherein the plural column ADCs include a first column ADC and a second column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and a digital processing circuit, configured to operably generate the plural digital signals, wherein the digital processing circuit generates the first digital signal according to the first digital count and the second digital signal;

wherein the array of the pixel sensing circuits are formed in at least one row and plural columns corresponding to the plural column ADCs, wherein each column of the pixel sensing circuits is configured to operably generate one corresponding analog signal which is coupled to one corresponding column ADC;

wherein during a conversion period, when the counter of the first column ADC starts to count before the level of the comparison result signal of the second column ADC transits, the counter of the first column ADC counts reversely.

12. The image sensor of claim 11, wherein the column parallel ADC circuit receives a ramp signal, wherein each of the plural column ADCs includes:

a comparator, configured to operably compare the corresponding analog signal and the ramp signal to generate a corresponding comparison result signal; and a counter, coupled to the comparator and configured to operably count to generate the corresponding digital count according to the corresponding comparison result signal;

wherein the counter of the first column ADC starts to count to generate the first digital count when the comparison result signals of the first column ADC and the second column ADC show that the first analog signal and the second analog signal are at different sides compared to the ramp signal.

13. The image sensor of claim 1, wherein the first digital signal is generated by summing the first digital count and the second digital signal.

14. The image sensor of claim 11, wherein a first column of the array of the pixel sensing circuits corresponding to the first column ADC is arranged geometrically neighboring to a second column of the array of the pixel sensing circuits corresponding to the second column ADC.

15. The image sensor of claim 11, wherein each column ADC generates a corresponding digital signal during a reset phase and a corresponding digital signal during a signal phase, wherein the digital processing circuit further generates a corresponding noise canceled digital signal by subtracting the corresponding digital signal during the reset phase from the corresponding digital signal during the signal phase;

wherein during the reset phase, the corresponding analog signal is coupled to a reset level, and during the signal phase, the corresponding analog signal is controlled by a sensing element which is configured to operably sense the image.

16. An image sensor, configured to operably capture an image, the image sensor comprising:

a column parallel analog-to-digital converter (ADC) circuit, configured to operably convert plural analog signals to respective plural digital signals; and an array of pixel sensing circuits, coupled to the column parallel ADC circuit and configured to operably sense the image;

the column parallel ADC circuit including:

plural column ADCs, configured to operably generate respective plural digital counts, wherein the plural column ADCs include a first column ADC and a second column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and a digital processing circuit, configured to operably generate the plural digital signals, wherein the digital processing circuit generates the first digital signal according to the first digital count and the second digital signal;

wherein the array of the pixel sensing circuits are formed in at least one row and plural columns corresponding to the plural column ADCs, wherein each column of the pixel sensing circuits is configured to operably generate one corresponding analog signal which is coupled to one corresponding column ADC;

wherein the plural column ADCs further includes a fourth column ADC, wherein a fourth column of the array of the pixel sensing circuits corresponding to the fourth column ADC is arranged geometrically in between a first column of the array of the pixel sensing circuits corresponding to the first column ADC and a second column of the array of the pixel sensing circuits corresponding to the second column ADC, wherein the fourth column ADC and the fourth column of the array of the pixel sensing circuits corresponding to the fourth column ADC is disabled in a power saving mode.

17. An image sensor, configured to operably capture an image, the image sensor comprising:

a column parallel analog-to-digital converter (ADC) circuit, configured to operably convert plural analog signals to respective plural digital signals; and an array of pixel sensing circuits, coupled to the column parallel ADC circuit and configured to operably sense the image;

the column parallel ADC circuit including:

plural column ADCs, configured to operably generate respective plural digital counts, wherein the plural column ADCs include a first column ADC and a second column ADC, wherein the first column ADC is configured to operably generate a first digital count according to a first analog signal, and the second column ADC is configured to operably generate a second digital count according to a second analog signal, wherein the first digital count is a difference between a first digital signal and a second digital signal, wherein the first and the second digital signals correspond to the first and the second analog signals respectively; and a digital processing circuit, configured to operably generate the plural digital signals, wherein the digital processing circuit generates the first digital signal according to the first digital count and the second digital signal;

wherein the array of the pixel sensing circuits are formed in at least one row and plural columns corresponding to the plural column ADCs, wherein each column of the pixel sensing circuits is configured to operably generate one corresponding analog signal which is coupled to one corresponding column ADC;

wherein the image sensor operates in one of the following modes:

(1) wherein in a back-side illumination (BSI) mode, during an exposure period, a pixel sensing circuit corresponding to the first column ADC is configured to generate the first analog signal, and the pixel sensing circuit corresponding to the first column ADC is exposed to the image by a shutter, and a pixel sensing circuit corresponding to the second column ADC is configured to generate the second analog signal, and the pixel sensing circuit corresponding to the second column ADC is not exposed to the image by the shutter;

wherein the digital processing circuit further selects the first digital count to be a noise canceled digital signal corresponding to the first column ADC; or (2) wherein an auxiliary light source is provided for capturing the image, wherein in a comparison mode, a pixel sensing circuit corresponding to the first column ADC is exposed to the image by a shutter during a first exposure period to generate the first analog signal, and a pixel sensing circuit corresponding to the second column ADC is exposed to the image by the shutter during a second exposure period to generate the second analog signal, wherein an intensity of the auxiliary light source during the first exposure period is higher than an intensity of the auxiliary light source during the second exposure period;

wherein the digital processing circuit further selects the first digital count to be a noise canceled digital signal corresponding to the first column ADC.

18. An analog-to-digital (A/D) conversion method, configured to operably convert plural analog signals to respective plural digital signals, the A/D conversion method comprising:

generating a first digital count according to a first analog signal;

generating a second digital count according to a second analog signal, wherein the first digital count is a difference between a first digital signal and a second digital signal, wherein the first and the second digital signals correspond to the first and the second analog signals respectively; and generating the first digital signal according to the first digital count and the second digital signal;

wherein during a conversion period, when the counting of the first digital count starts to count before the level of the comparison result for counting the second digital count transits, the first digital count is counted reversely.

19. The A/D conversion method of claim 18, wherein the steps of generating each of the digital counts includes:

comparing the corresponding analog signal and a ramp signal to generate a corresponding comparison result; and counting to generate the corresponding digital count according to the corresponding comparison result;

wherein the counting of the first digital count starts when the corresponding comparison results for counting the first digital count and counting the second digital count show that the first analog signal and the second analog signal are at different sides compared to the ramp signal.

20. The A/D conversion method of claim 18, wherein the first digital signal is generated by summing the first digital count and the second digital signal.

21. An analog-to-digital (A/D) conversion method, configured to operably convert plural analog signals to respective plural digital signals, the A/D conversion method comprising:

generating a first digital count according to a first analog signal;

generating a second digital count according to a second analog signal, wherein the first digital count is a difference between a first digital signal and a second digital signal, wherein the first and the second digital signals correspond to the first and the second analog signals respectively; and generating the first digital signal according to the first digital count and the second digital signal;

wherein the A/D conversion method operates in one of the following modes:

(1) wherein in a back-side illumination (BSI) mode, during an exposure period, a first pixel sensing circuit is configured to generate the first analog signal, and the first pixel sensing circuit is exposed to the image by a shutter, and a second pixel sensing circuit is configured to generate the second analog signal, and the second pixel sensing circuit is not exposed to the image by the shutter;

the A/D conversion method further comprising: selecting the first digital count to be a first noise canceled digital signal;

(2) wherein an auxiliary light source is provided for capturing the image, wherein in a comparison mode, a first pixel sensing circuit is exposed to the image by a shutter during a first exposure period to generate the first analog signal, and a second pixel sensing circuit is exposed to the image by the shutter during a second exposure period to generate the second analog signal, wherein an intensity of the auxiliary light source during the first exposure period is higher than an intensity of the auxiliary light source during the second exposure period;

the A/D conversion method further comprising: selecting the first digital count to be a first noise canceled digital signal; or (3) The A/D conversion method of claim 18, wherein the A/D conversion method further comprising:

determining whether to enter a basic mode according a spatial characteristic of an image captured during an earlier time period;

wherein in the basic mode, the first digital count corresponds to the first digital signal, the A/D conversion method comprising:

selecting the first digital count to be the first digital signal; and selecting the second digital count to be the second digital signal.

* * * * *